(12) United States Patent
    Wang

(10) Patent No.: US 7,982,205 B2
(45) Date of Patent:    Jul. 19, 2011

(54) III-V GROUP COMPOUND SEMICONDUCTOR LIGHT-EMITTING DIODE

(75) Inventor: Xue-Lun Wang, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 590 days.

(21) Appl. No.: 11/651,994

(22) Filed: Jan. 11, 2007

(65) Prior Publication Data

US 2007/0200135 A1    Aug. 30, 2007

(30) Foreign Application Priority Data

Jan. 12, 2006 (JP) ................ 2006-004595

(51) Int. Cl.
*H01L 29/06* (2006.01)

(52) U.S. Cl. ......... 257/13; 257/79; 257/103; 257/627; 257/E33.003; 257/E33.032

(58) Field of Classification Search ............ 257/13, 257/79, 103, 627–628; 438/22, 427–428
See application file for complete search history.

(56) References Cited

U.S. PATENT DOCUMENTS

| | | | | |
|---|---|---|---|---|
| 4,080,245 A | * | 3/1978 | Yamanaka et al. | ........... 438/40 |
| 4,805,179 A | * | 2/1989 | Harder et al. | ......... 372/46.011 |
| 5,528,615 A | * | 6/1996 | Shima | .......... 372/45.01 |
| 5,656,821 A | * | 8/1997 | Sakuma | ............. 257/14 |
| 5,854,089 A | * | 12/1998 | Nakatsu | ............. 438/41 |
| 2002/0145148 A1 | * | 10/2002 | Okuyama et al. | ........... 257/88 |
| 2003/0168666 A1 | * | 9/2003 | Okuyama et al. | ........... 257/80 |
| 2005/0145865 A1 | * | 7/2005 | Okuyama et al. | ........... 257/98 |
| 2007/0145382 A1 | * | 6/2007 | Choi et al. | ........... 257/79 |
| 2008/0006831 A1 | * | 1/2008 | Ng | ........... 257/79 |

FOREIGN PATENT DOCUMENTS

| | | | |
|---|---|---|---|
| JP | 5-206565 | * | 8/1993 |
| JP | 7-122486 | * | 5/1995 |

OTHER PUBLICATIONS

M.R. Krames et al., Applied Physics Letters, Oct. 18, 1999, vol. 75, No. 16, pp. 2365-2367.
H. Benisty et al., IEEE Journal of Quantum Electronics, Sep. 9, 1998, vol. 34, No. 9, pp. 1612-1631.
R. Windisch et al., IEEE Transactions on Electron Devices Jul. 2000, vol. 47, No. 7, pp. 1492-1498.
H. Sugawara et al., Applied Physics Letters Mar. 11, 1991, vol. 58, No. 10, pp. 1010-1012.

(Continued)

*Primary Examiner* — A. Sefer
(74) *Attorney, Agent, or Firm* — Birch, Stewart, Kolasch & Birch, LLP

(57) ABSTRACT

A III-V group compound semiconductor light-emitting diode, containing a substrate 1 having plural crystal planes, and a grown layer formed on the substrate by epitaxial growth, the grown layer at least including a barrier layer 2 and 3 and an active layer 8, wherein at least the active layer of the grown layer has plural crystal planes each having a different bandgap energy in the in-plane direction, and an Ohmic electrode 4 for current injection is formed on a crystal plane (3) having a higher bandgap energy among the plural crystal planes.

20 Claims, 7 Drawing Sheets
(3 of 7 Drawing Sheet(s) Filed in Color)

OTHER PUBLICATIONS

D.J. Lawrence et al., IEEE Transactions on Electron Devices, Jun. 6, 1983, vol. ED-30, No. 6, pp. 580-585.

J.-F. Lin et al., Electronics Letters, Oct. 13, 1994, vol. 30, No. 21, pp. 1793-1794.

H. Sugawara et al., Applied Physics Letters, Oct. 12, 1992, vol. 61, No. 15, pp. 1775-1777.

Xue-Lun Wang, Japanese Journal of Applied Physics, (2006), vol. 45, No. 33, pp. L874-L877.

Xue-Lun Wang, Conference Digest published in the 64th Device Research Conference, the Pennsylvania State University, Jun. 26 and 28, 2006, pp. 133-134.

\* cited by examiner

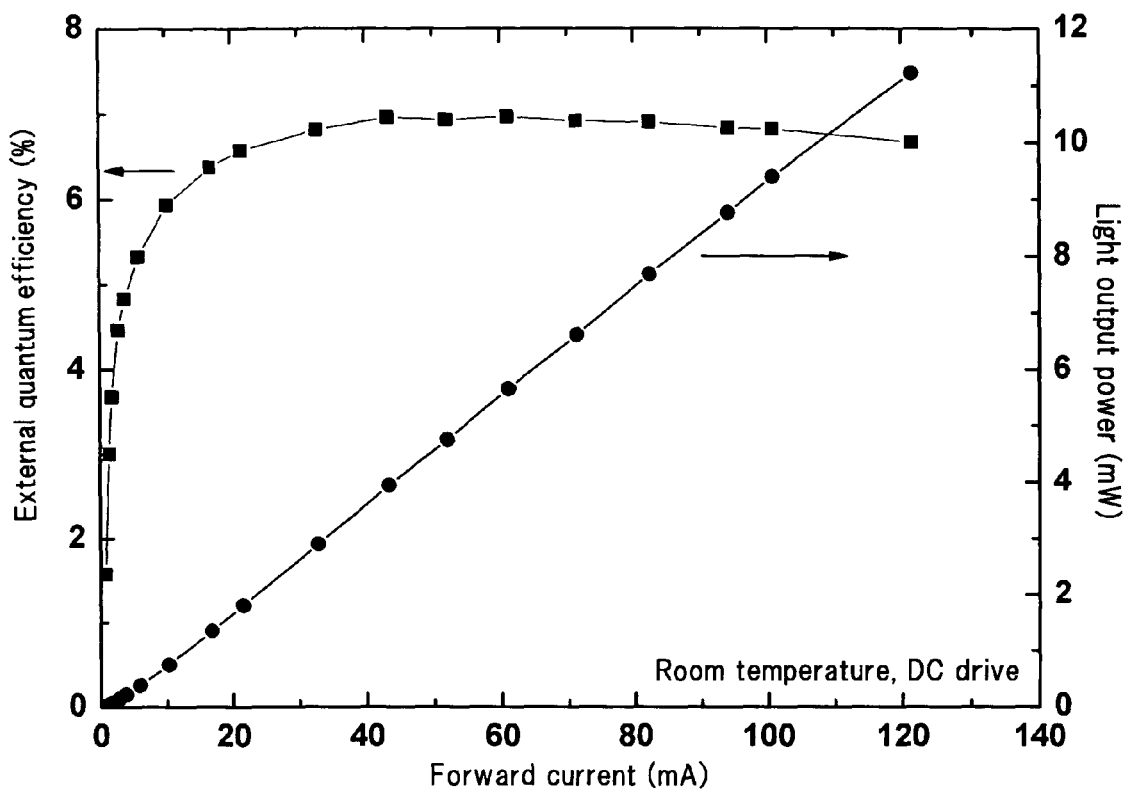

▦ First crystal facet
▨ At least one crystal facet
▩ Second crystal facet

III-V GROUP COMPOUND SEMICONDUCTOR LIGHT-EMITTING DIODE

FIELD OF THE INVENTION

The present invention relates to a high-efficiency light-emitting diode using a III-V group compound semiconductor as a raw material, and, specifically to a III-V group compound semiconductor light-emitting diode which is improved in the efficiency of extracting light to the outside space, by separating a light-extraction area from a current-injection area.

BACKGROUND OF THE INVENTION

There is great current interest in a light-emitting diode, whose raw material is a III-V group compound semiconductor (for example, AlGaAs, AlGaInP and AlGaInN), as an energy saving and long-lifetime light source for lighting devices in the next generation which will be used in place of an incandescent lamp and a fluorescent lamp.

The light-emitting efficiency of a light-emitting diode is generally determined by the product of the internal quantum efficiency and the efficiency of extraction of light to the outside space. With regard to internal quantum efficiency, particularly that in a system of AlGaAs or AlGaInP-series material, almost 100% of the internal quantum efficiency has been realized by the recent progress in crystal growth technologies. On the other hand, it is very difficult to efficiently extract the light generated in the active layer to the outside space. It is not too much to say that this is the largest factor limiting the light-emitting efficiency of a light-emitting diode.

Two fundamental reasons are responsible for that problem. A first reason resides in the problem concerning the so-called total internal reflection of light. Specifically, the refractive index of a III-V group compound semiconductor is generally considerably larger than 1, and a large part of the light to be emitted is totally reflected at the interface between the semiconductor and the air and is returned back into the semiconductor. Light which can be extracted from the system to the outside space is one incident to the interface at an angle smaller than the critical angle of total internal reflection. In the case of, for example, GaAs, the critical angle of total internal reflection is about 16.1°. The ratio of the light whose critical angle is within this value is only: $0.5\times(1-\cos 16.1°)=2\%$. Moreover, a part of the light within the critical angle is reflected on the surface, and the light that can be extracted from the system to the outside space is indeed only about 1%. In order to suppress the total internal reflection of light, hitherto, the below-mentioned methods, for example, have been adopted: (1) a method in which a resin having a high refractive index is used to encapsulate; (2) a method in which the crystal is formed into an inverse pyramid shape by dicing {M. R. Krames, M. Ochiai-Holcomb, G. E. Hofler, C. Carter-Coman, E. I. Chen, I. -H. Tan, P. Grillot, N. F. Gardner, H. C. Chui, J. -W. Huang, S. A. Stockman, F. A. Kish, M. G. Craford, T. S. Tan, C. P. Kocot, M. Hueschen, J. Posselt, B. Loh, G. Sasser, and D. Collins, "High-power truncated-inverted-pyramid $(Al_xGa_{1-x})_{0.5}In_{0.5}P/GaP$ light-emitting diodes exhibiting >50% external quantum efficiency", Applied Physics Letters, 75 (1999) 2365-2367.}; (3) a microcavity is used to control the radiation of light {H. Benisty, H. DeNeve, and C. Weisbuch, "Impact of planar microcavity effects on light extraction-part I: Basic concepts and analytical trends", IEEE Journal of Quantum Electronics, 34 (1998) 1612-1631.}; and (4) fine roughness is intentionally formed on the surface of a semiconductor, to change the incident angle of light, by utilizing the scattering of light at the interface (R. Windisch, B. Dutta, M. Kuijk, A. Knobloch, S. Meinlschmidt, S. Schoberth, P. Kiesel, G. Borghs, G. H. Dohler, and P. Heremans, "40% Efficient Thin-Film Surface-Textured Light-Emitting Diodes by Optimization of Natural Lithography", IEEE Transactions on Electron Devices, 47 (2000) 1492-1498.}.

A second reason resides in the blocking of light by an opaque metal electrode. The driving current of a light-emitting diode is usually injected from a metal electrode formed on the surface of a crystal. In this case, though the density of current just under the electrode is the highest of all, the light generated there is almost blocked by the electrode. Therefore, the light is not allowed to escape to the outside space. In order to solve this problem, some techniques have been proposed which are developed by focusing on diffusion of the injected current to the outside area of an electrode region in the lateral direction as much as possible. Typical techniques include: (1) a method in which a thick current-spreading layer (about 10 μm) is provided between an active layer and an electrode {H. Sugawara, M. Ishikawa, and G. Hatakoshi, "High-efficiency InGaAlP/GaAs visible light-emitting diodes", Applied Physics Letters, 58 (1991) 1010-1012.}; (2) a method in which a composite structure of a metal electrode and an ITO transparent electrode is used {D. J. Lawrence, D. C. Abbas, D. J. Phelps, and F. T. J. Smith "$GaAs_{0.6}P_{0.4}$ LED's with efficient transparent contacts for spatially uniform light emission", IEEE Transactions on Electron Devices, ED-30 (1983) 580-585; J. -F. Lin, M. -C. Wu, M. -J. Jou, C. -M. Chang, B. -J. Lee, and Y. -T. Tsai, "Highly reliable operation of indium tin oxide AlGaInP orange light-emitting diodes", Electronics Letters, 30 (1994) 1793-1794.}; and (3) a method in which a current-blocking layer is introduced into a place just under the electrode {H. Sugawara, K. Itaya, H. Nozaki, and G. Hatakoshi, "High-brightness InGaAlP green light-emitting diodes", Applied Physics Letters, 61 (1992) 1775-1777.}. However, even if any of these structures is adopted, the situation where the density of current just under the metal electrode or in the vicinity thereof is the highest of all is not changed, and the effects of these structures are limited. Further, these structures give rise to the problem that the introduction of the thick current-spreading layer or current-blocking layer complicates production processes of such the devices and raises production cost.

Moreover, in each structure of the conventional light-emitting diodes, carriers injected from an electrode are concentrated in the vicinity of the electrode and the density of carriers, i.e. luminescence intensity, sharply decreases at a place apart from the electrode. Thus, there is a limitation to the output power of light obtained from one light-emitting diode chip. In the case of applications requiring high output light power, it is necessary to use a large number of chips.

SUMMARY OF THE INVENTION

The present invention contemplates providing a highly efficient light-emitting diode using a III-V group compound semiconductor as a raw material, the light-emitting diode being perfectly free, in principle, from the above problem concerning light blocking caused by a metal electrode, and being able to efficiently suppress the total internal reflection at the interface. Further, the present invention also contemplates providing a highly efficient light-emitting diode using a III-V group compound semiconductor as a raw material, the light-emitting diode allowing high output light power to be easily obtained from a single chip, as the output light power of a light-emitting diode increases in proportion to area of the chip.

According to the present invention, there is provided the following means:

(1) A III-V group compound semiconductor light-emitting diode, comprising a substrate having plural crystal planes, and a grown layer formed on the substrate by epitaxial growth, the grown layer at least including a barrier layer and an active layer, wherein at least said active layer of said grown layer has plural crystal planes each having a different bandgap energy in the in-plane direction, and an Ohmic electrode for current injection is formed on a crystal plane having a higher bandgap energy among the plural crystal planes;

(2) A III-V group compound semiconductor light-emitting diode, comprising a substrate having plural crystal planes, and a grown layer formed on the substrate by epitaxial growth, the grown layer at least including a barrier layer and an active layer, wherein at least said active layer of said grown layer has plural crystal planes each having a different bandgap energy in the in-plane direction, a first Ohmic electrode for current injection is formed on a crystal plane having a higher bandgap energy among the plural crystal planes, and a second Ohmic electrode for current injection is formed on a crystal plane having a higher bandgap energy after removing the substrate from the grown layer;

(3) The III-V group compound semiconductor light-emitting diode according to Item (1) or (2), wherein said plural crystal planes each having a different bandgap energy comprise a first crystal plane having a higher bandgap energy among the plural crystal planes, a second crystal plane having a lower bandgap energy, and at least one crystal plane positioned between the first and second crystal planes, and wherein the at least one crystal plane positioned between the first and second crystal planes has a bandgap energy between the bandgap energy of said first crystal plane and the bandgap energy of said second crystal plane;

(4) The III-V group compound semiconductor light-emitting diode according to any one of Items (1) to (3), wherein a large number of said plural crystal planes each having a different bandgap energy are provided in array in the in-plane direction;

(5) The III-V group compound semiconductor light-emitting diode according to any one of Items (1) to (4), wherein said substrate has a groove shape which extends along the [1-10] direction and is constituted of two (111)A facets, a top (001) facet, and a bottom (001) facet, and wherein, among the plural crystal planes each having a different bandgap energy, the crystal plane having a lower bandgap energy and the crystal plane having a higher bandgap energy are grown on the (001) facet and the (111)A facet of said substrate, respectively, and said Ohmic electrode is formed on the (111)A facet;

(6) The III-V group compound semiconductor light-emitting diode according to any one of Items (1) to (4), wherein said substrate has a V-groove shape which extends along the [1-10] direction and is constituted of two (111)A facets and a top (001) facet, and wherein, among the plural crystal planes each having a different bandgap energy, the crystal plane having a lower bandgap energy and the crystal plane having a higher bandgap energy are grown on the (001) facet and the (111)A facet of said substrate, respectively, and said Ohmic electrode is formed on the (111)A facet;

(7) The III-V group compound semiconductor light-emitting diode according to any one of Items (1) to (4), wherein said substrate has a (111)A facet, a top (001) facet, and at least one higher-index facet formed between the (111)A facet and the top (001) facet, and wherein, among the plural crystal planes each having a different bandgap energy, the crystal plane having a lower bandgap energy and the crystal plane having a higher bandgap energy are grown on the top (001) facet and the (111)A facet of said substrate, respectively, and said Ohmic electrode is formed on the (111)A facet; and (8) The III-V group compound semiconductor light-emitting diode according to any one of Items (1) to (7), wherein said active layer is to be a quantum well (QWL) structure in the case where the active layer is formed of a binary compound, or to be a quantum well structure or a bulk structure in the case where the active layer is formed of a ternary or quaternary alloy.

Herein, the term "[1-10] direction" means the [110] direction.

Other and further features and advantages of the invention will appear more fully from the following description, appropriately referring to the accompanying drawings.

BRIEF DESCRIPTION OF THE DRAWINGS

The patent or application file contains at least one drawing executed in color. Copies of this patent or patent application publication with color drawing(s) will be provided by the office upon request and payment of the necessary fee.

FIG. 9 is a graph showing injection current dependence of the output light power and the external quantum efficiency of the above 1×1 mm$^2$ chip.

DETAILED DESCRIPTION OF THE INVENTION

Some embodiments according to the present invention will be explained in below, with reference to FIGS. 1 to 10, but the invention is not intended to be limited thereto.

Figure 1:
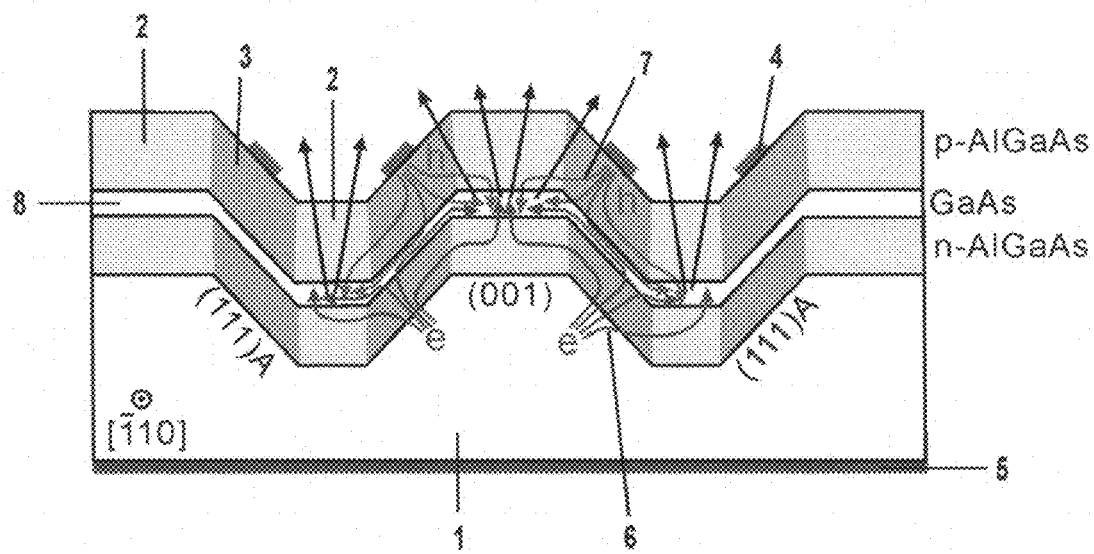
FIG. 1 is a schematic sectional view for explaining the fundamental structure of one embodiment of the III-V group compound semiconductor light-emitting diode of the present invention.
Figure 2:
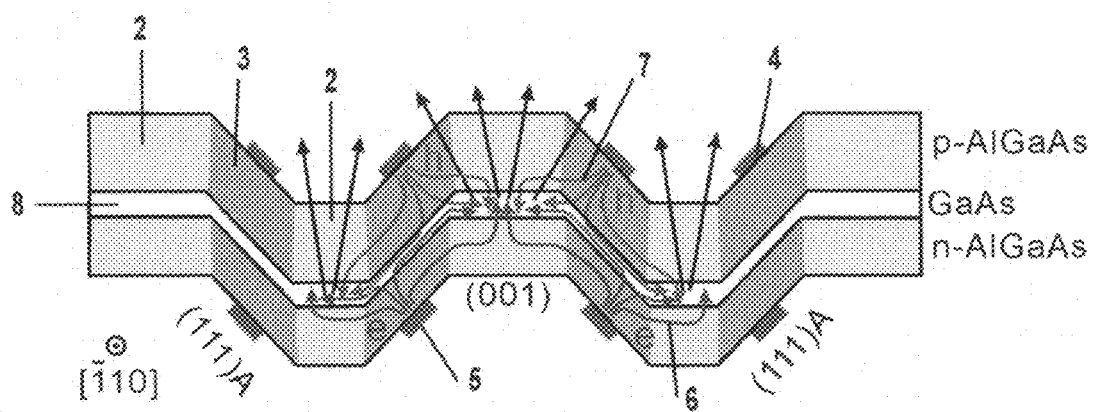
FIG. 2 is a schematic sectional view for explaining the fundamental structure of another embodiment of the III-V group compound semiconductor light-emitting diode of the present invention.

FIGS. 1 and 2 each are a schematic sectional view for explaining fundamental structure of the III-V group compound semiconductor light-emitting diode according to an embodiment of the present invention.

In these figures, reference numeral 1 represents a n-type (001) GaAs substrate, 2 represents an AlGaAs region with a lower Al composition of an AlGaAs barrier layer, 3 represents an AlGaAs region with a higher Al composition of an AlGaAs barrier layer, 4 represents a p-type Ohmic electrode, 5 represents a n-type Ohmic electrode, 6 represents the migration direction of electrons, 7 represents the migration direction of holes, and 8 represents a GaAs quantum well active layer.

The fundamental structure of the III-V group compound semiconductor light-emitting diode of the present invention will be explained with reference to the schematic FIGS. 1 and 2. First, U-shaped grooves each having a (111)A sidewall or slant facet and two of the top and bottom (001) flat facets are formed in array along the [1-10] direction, on a (001) flat GaAs substrate 1, by photolithography and wet etching. Then, a multilayer film of a compound semiconductor, for example, (Al)GaAs/AlGaAs, constituting a light-emitting diode structure, is grown on the above substrate 1 having the above processed shape, by using a crystal growth method such as metal-organic vapor-phase epitaxy (MOVPE). In the case where a multilayer of a compound semiconductor is grown on such a substrate having a non-planar shape, a part of III group atoms tend to migrate from the (111)A sidewall facet to the top and bottom (001) flat facets, under proper growth conditions. Further, in this migration process, the migration speed of a Ga atom is generally higher than that of an Al atom. Because of these anisotropies of crystal growth processes, the grown film thickness and the Al composition of crystal are made different according to the directions of crystal planes. Specifically, the film thickness of the (111)A sidewall facet is thinner than that of the top and bottom (001) flat facets, and the Al composition (i.e. an Al content) in the (111)A sidewall facet is higher than that of the (001) flat facet. Thus, when an (Al)GaAs quantum well is used for the active layer 8, the energy level of the quantum well of the (111)A sidewall facet is higher than each of the energy levels of the quantum wells of the top and bottom (001) flat facets, due to quantum confinement effect and the dependency of bandgap energy on Al composition. Here, explanations are given as to the quantum well active layer, but in the case of using ternary or quaternary alloys such as AlGaAs and AlGaInP for a material of the active layer, a bulk structure may be adopted as the structure of the active layer.

Finally, the Ohmic electrode 4 on the surface side for current injection is selectively formed on a part of the (111)A sidewall facet in such a manner as to sweep away from the path of radiation of the light emitted from the (001) flat facet as completely as possible. In this structure, a part of carriers injected from the (111)A sidewall facet are transferred to the (001) flat facet quantum well lower in energy level through the (Al)GaAs active layer or the (Al)GaAs active layer and AlGaAs barrier layer, to allow to emit light there. In this case, the proportion of the carriers to transfer to the (001) flat facet increases exponentially with respect to the energy difference between the (111)A sidewall facet quantum well and the (001) flat facet quantum well. Thus, if the energy difference between the sidewall facet quantum well and the flat facet quantum well is sufficiently larger than the thermal energy, almost 100% of the carriers can transfer to the (001) flat facet. This, in other words, means that the density of carriers just under the Ohmic electrode is infinitely close to 0 (zero). Therefore, in the light-emitting diode of the present invention, unlike the conventional techniques, a place just under the electrode corresponds to an area where carrier saturations are most difficult to occur and the Ohmic electrode can be formed in an infinitely small size, in principle. For example, if current photolithographic techniques are used, an Ohmic electrode of width 1 μm or less can be formed easily. If the width of the Ohmic electrode 4 is made to be sufficiently smaller than the luminous area in this manner, the current injection area can be perfectly separated spatially from the luminous area, and it is therefore possible, in principle, to completely prevent the metal electrode from blocking the light to be radiated into the upward hemispherical space.

Further, as shown in FIG. 2, the shaped substrate used for the growth in the invention as in FIG. 1 is removed from the epitaxial growth layer which is to be a body of the light-emitting diode structure, by such a method as selective etching or epitaxial liftoff; and the Ohmic electrode 5 on the backside of the growth layer removed from the substrate is formed selectively in a small area of a part of the (111)A sidewall facet, in such a manner as to sweep away from the path of radiation of the light to be emitted from the (001) flat facet quantum well as completely as possible, in the similar manner as in the case of the Ohmic electrode 4 on the surface side. This prevents the metal electrode from blocking the light to be radiated into the whole space, and it is expected that the light extraction efficiency close to 100% could be realized.

Also, a convex sectional shape composed of the (111)A sidewall facet and the top (001) flat facet acts as a micro lens, and it is therefore possible to suppress the total internal reflection at the semiconductor-air interface efficiently. That is, fundamentally, a part of the light incident to the (001) flat facet at a larger angle than the critical angle of total internal reflection can be incident to the (111)A sidewall facet at a lower angle than the critical angle of the total internal reflection, and the ratio of the light which can be extracted to the outside space is increased.

Moreover, as is apparent from the above explanation, many U-shaped groove patterns are arranged in array on the substrate. Thus, unlike the conventional devices, the light-emitting device of the present invention is free from the in-plane distribution of luminous intensity; and since light is generated uniformly over the whole substrate, it is possible to extract easily a high light-output power from a single chip by making a chip to have a larger area.

Next, a method of producing an AlGaAs/GaAs light-emitting diode using a V-groove shape GaAs substrate according to the present invention will be explained with reference to FIGS. 3 to 6 (Example 1).

In these figures, reference numeral 9 represents a Si-doped n-type $Al_{0.65}Ga_{0.35}As$ barrier layer, 10 represents a non-doped $Al_{0.3}Ga_{0.7}As$ barrier layer, 11 represents a non-doped $Al_{0.3}Ga_{0.7}As$ barrier layer, 12 represents a Zn-doped p-type $Al_{0.65}Ga_{0.35}As$ barrier layer, 13 represents a non-doped GaAs quantum well active layer, 14 represents a Zn-doped GaAs cap layer, 15 represents a $SiO_2$ film, 16 represents a Si-doped n-type GaAs buffer layer, 17 represents a Si-doped n-type (001) flat facet $Al_{0.65}Ga_{0.35}As$ barrier layer, 18 represents a Si-doped n-type (111)A sidewall facet $Al_{0.69}Ga_{0.31}As$ barrier layer, 19 represents a Si-doped n-type $Al_{0.61}Ga_{0.39}As$ vertical quantum well, 20 represents a non-doped (001) flat facet $Al_{0.3}Ga_{0.7}As$ barrier layer, 21 represents a non-doped (111)A sidewall facet $Al_{0.34}Ga_{0.66}As$ barrier layer, 22 represents a non-doped $Al_{0.26}Ga_{0.74}As$ vertical quantum well, 23 represents a non-doped (001) flat facet GaAs quantum well, 24 represents a non-doped (111)A sidewall facet GaAs quantum well, 25 represents a non-doped V-groove bottom crescent-shaped GaAs quantum wire, 26 represents a non-doped (001) flat facet $Al_{0.3}Ga_{0.7}As$ barrier layer, 27 represents a non-doped (111)A sidewall facet $Al_{0.34}Ga_{0.66}As$ barrier layer, 28 represents a non-doped $Al_{0.26}Ga_{0.74}As$ vertical quantum well, 29 represents a Zn-doped p-type (001) flat facet $Al_{0.65}Ga_{0.35}As$ barrier layer, 30 represents a Zn doped p-type (111)A sidewall facet $Al_{0.69}Ga_{0.31}As$ barrier layer, 31 represents a Zn-doped p-type $Al_{0.61}Ga_{0.39}As$ vertical quantum well, 32 represents a n-type Ohmic electrode (AuGe/Ni/Au), 33 represents a p-type Ohmic electrode (Ti/Au), and 34 represents a Cr/Au bonding pad.

This V-groove shape substrate is formed by etching until the bottom (001) flat facet is completely removed in the production of the U-shaped substrate of FIG. 1. The substrate has the advantage that the Ohmic electrode on the surface side can be formed in a self-aligned manner.

Figure 3:
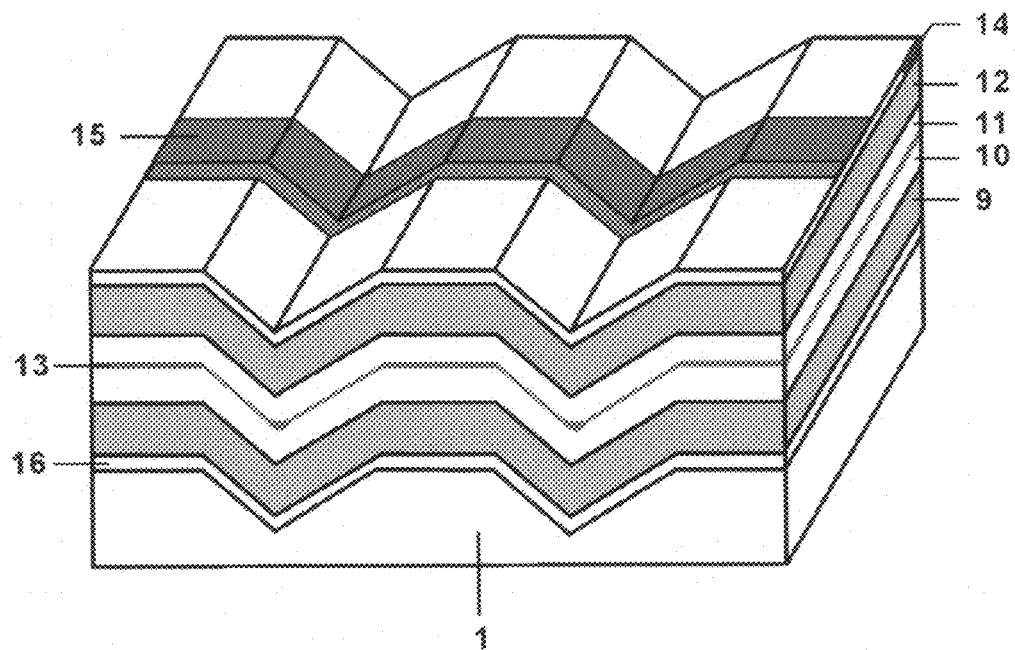
FIG. 3 is a three-dimensional schematic view showing an example of the process of manufacturing the III-V group compound semiconductor light-emitting diode of the present invention.

As shown in FIG. 3, on the n-type (001) GaAs substrate 1, V-groove patterns were formed in a 4-μm period in the [1-10] direction, by using photolithography and wet etching ($NH_4OH:H_2O_2:H_2O=1:3:50$). Then, on the above substrate 1, by using the metal-organic vapor phase epitaxy method, grown were the 0.37-μm-thick Si-doped n-type GaAs buffer layer 16, the 0.71-μm-thick Si-doped n-type $Al_{0.65}Ga_{0.35}As$ barrier layer 9, the 0.25-μm-thick non-doped $Al_{0.3}Ga_{0.7}As$ barrier layer 10, the 14.5-nm-thick non-doped GaAs quantum well active layer 13, the 0.15-μm-thick non-doped $Al_{0.3}Ga_{0.7}As$ barrier layer 11, the 0.73-μm-thick Zn-doped p-type $Al_{0.65}Ga_{0.35}As$ barrier layer 12, and the 25-nm-thick Zn-doped p-type GaAs cap layer 14, in this order. Here, the composition of Al and the grown film thickness was measured on the (001) top flat facet. In this growth, trimethylaluminum (TMAl), triethylgallium (TEGa) and tertiary-butylarsine (TBAs) were used as the raw materials of Al, Ga and As, respectively. Also, the growth temperature was set to 690° C.

Figure 4:
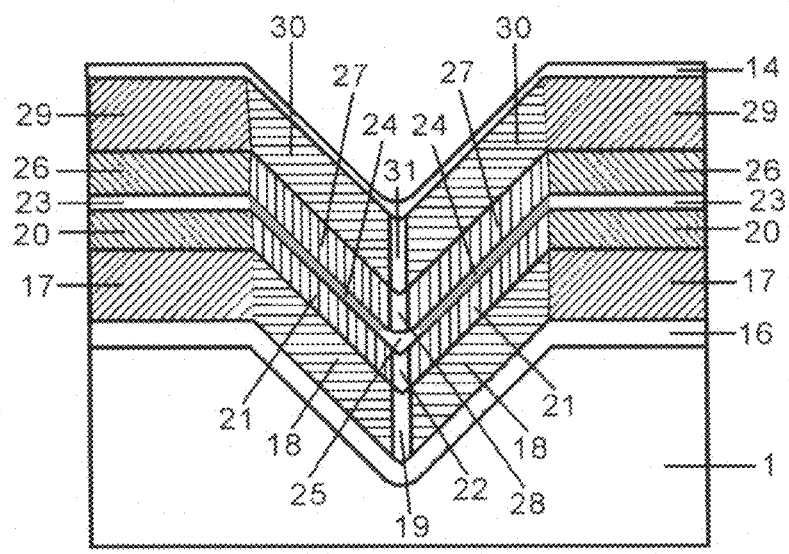
FIG. 4 is a schematic sectional view showing the detail of crystal structure of a sample of the III-V group compound semiconductor light-emitting diode of the present invention.

FIG. 4 is a schematic sectional view showing the details of the crystal structure of the above light-emitting diode sample. As shown in this figure, on the bottom of the V-groove, the GaAs quantum well layer and the AlGaAs barrier layer formed a crescent-shaped quantum wire 25 (lateral width about 40 nm) and a vertical stripe structure of width about 15 nm and low in the Al composition, called vertical quantum wells 19, 22, 28 and 31, respectively. The Al composition in each crystal plane of the non-doped AlGaAs barrier layers 10 and 11, specifically the (001) flat facet, the (111)A sidewall facet and the V-groove bottom vertical quantum well, was measured by photoluminescence, and the results were about 0.3 (bandgap energy at the room temperature=1.798 eV), 0.34 (bandgap energy at the room temperature=1.848 eV), and 0.26 (bandgap energy at the room temperature=1.748 eV), respectively. Further, the thicknesses of the (001) flat facet quantum well 23, (111)A sidewall facet quantum well 24 and crescent-shaped quantum wire 25 on the V-groove bottom were about 14.5, 7.3 and 15.4 nm, respectively.

Then, a $SiO_2$ film of thickness 140 nm was deposited on the surface of the sample by a plasma CVD method, and the 200-μm-wide stripe pattern 15 for forming a bonding pad was formed in the vertical direction of the V-groove, by photolithography and wet etching.

Figure 5:
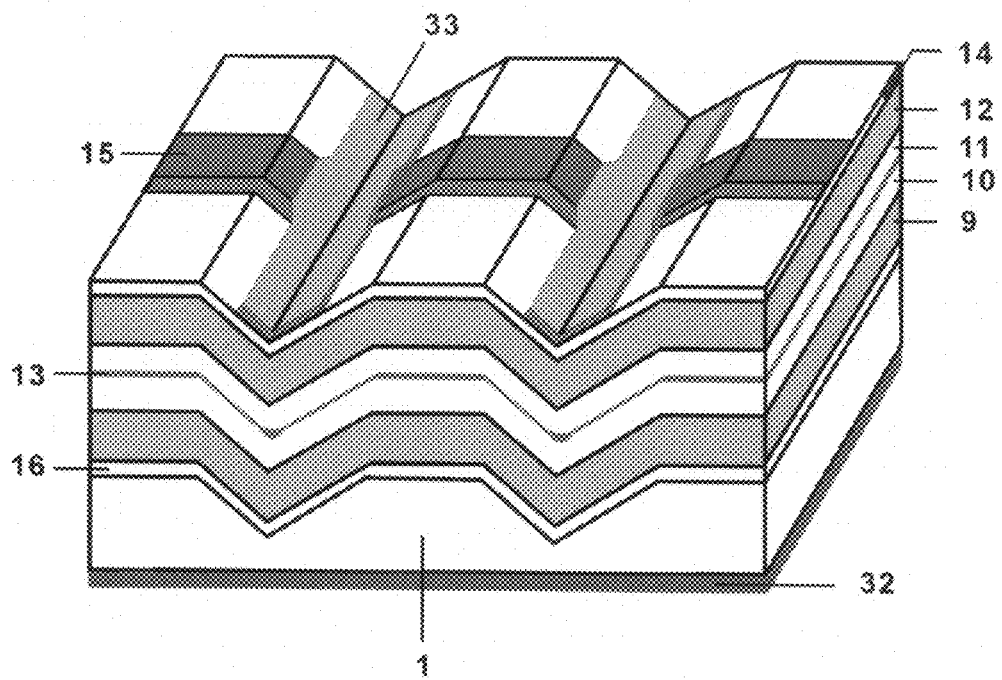
FIG. 5 is a three-dimensional schematic view showing an example of the process of manufacturing the III-V group compound semiconductor light-emitting diode of the present invention.

Next, as shown in FIG. 5, Ti (40 nm) and Au (150 nm) were deposited on the surface by a vacuum deposition method, as metals for forming a p-type Ohmic electrode. Then, a photoresist was coated, to flatten the surface of the V-groove. After that, $O_2$ plasma ashing was carried out, to expose the (001) flat facet and a part of the (111)A sidewall facet such that the photoresist was partly left only in the V-groove. Then, the photoresist left in the V-groove was used as a mask, to etch Au and Ti by using $KI:I_2$ type and $HF:H_2O_2:H_2O$ type etching solutions, respectively, thereby to form the p-type Ohmic electrode 33 on the (111)A sidewall facet and the V-groove bottom. It is to be noted that the p-type Ohmic electrode 33 may be formed using photolithography and liftoff techniques. Then, AuGe/Ni/Au was deposited in vacuum on the entire back surface of the sample, to form a n-type electrode. Finally, alloy treatment was carried out, to complete the p-type Ohmic electrode 33 and the n-type Ohmic electrode 32.

Figure 6:
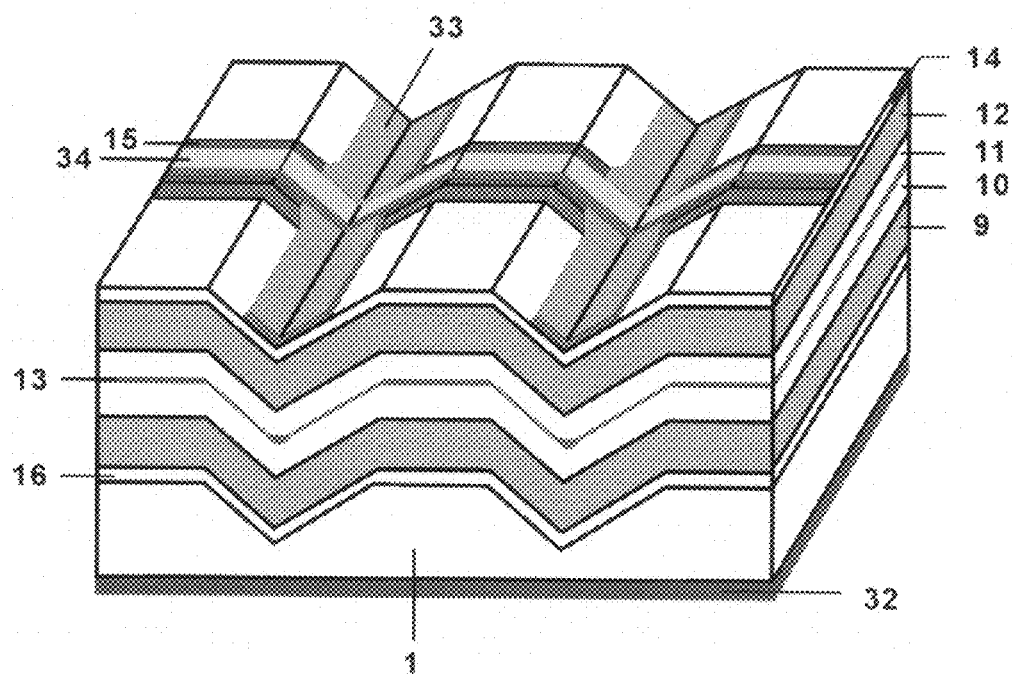
FIG. 6 is a three-dimensional schematic view showing an example of the process of manufacturing the III-V group compound semiconductor light-emitting diode of the present invention.

Then, in FIG. 6, as the bonding pad, on the stripe of the $SiO_2$ film 15, the Cr/Au pattern (180 μm) 34 having a slightly narrower width was formed by photolithography and a liftoff method, to complete a device.

Figure 7:
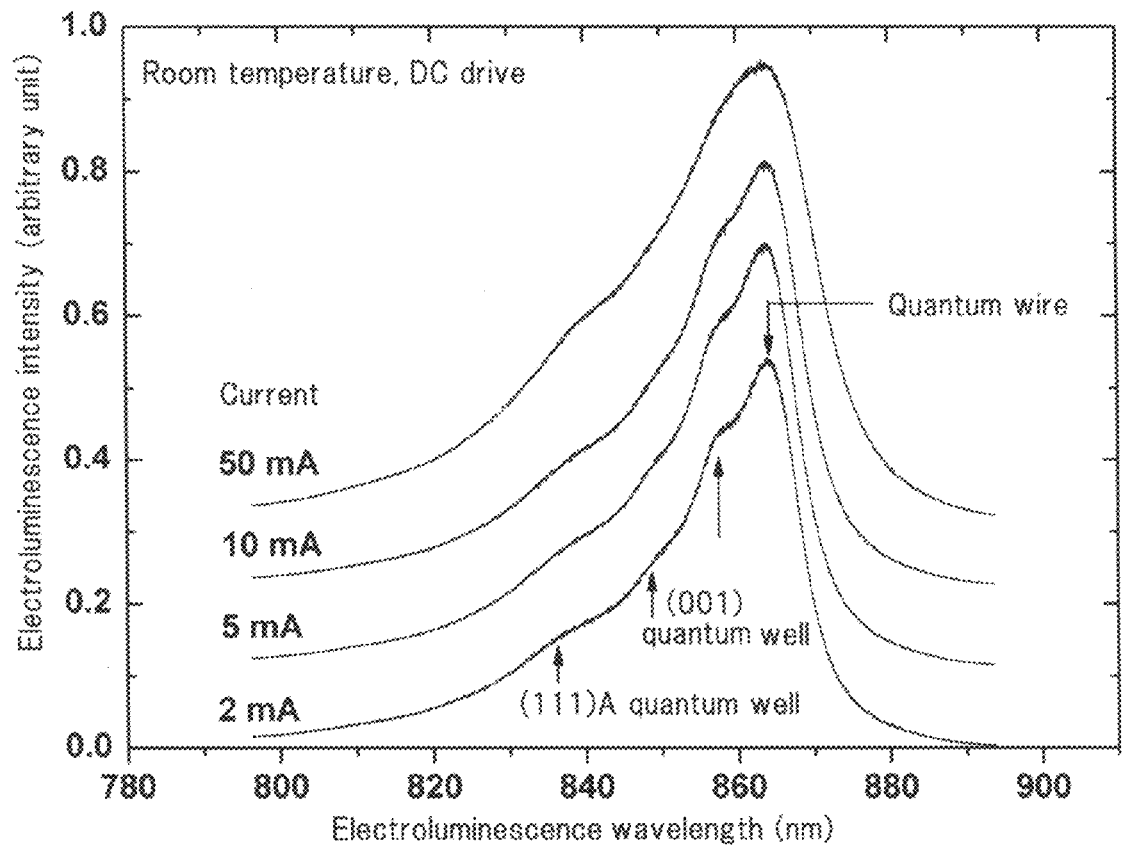
FIG. 7 is a graph showing electroluminescence (EL) spectra of a chip of size 1×1 mm$^2$ (a bonding pad area is excluded), which is measured in the conditions of the room temperature and DC drive.

FIG. 7 is a graph showing electroluminescence spectra of a chip of size $1 \times 1$ mm$^2$ (a bonding pad area is excluded), which was measured under the conditions of at the room temperature and DC drive.

It is to be noted that the chip used for the measurement is only die-bonded to a lead frame and is not encapsulated by an epoxy resin.

As shown in the figure, emissions from the (111)A sidewall facet quantum well, the (001) flat facet quantum well and the V-groove bottom quantum wire are observed at wavelengths near 836.2 nm, 848.7 nm and 857.5 nm, and 864.3 nm, respectively. Strong light-emission from the (001) flat facet quantum well is observed, and it is thus clearly confirmed that the carriers injected from the (111)A sidewall facet transfer to the (001) flat facet efficiently. Further, though not shown here, in the measurement at a low temperature of about 100 K, almost no light-emission from the (111)A sidewall facet quantum well was observed, and it is clarified that the carriers injected from the (111)A sidewall facet transfer to the (001) flat facet quantum well and the quantum wire at the V-groove bottom with an efficiency close to 100% at this temperature. The reason why the luminescence from the (111)A sidewall facet quantum well was observed at the room temperature is assumed that the difference in light-emission energy of the sample used in the experiment between the (111)A sidewall facet quantum well and the (001) flat facet quantum well is small (21.8 to 36.8 meV), and that a part of the carriers are excited from the (001) quantum well back to the (111)A quantum well by thermal energy (26 meV) at the room temperature. This phenomenon can be solved by optimization of growth conditions or by the use of an alloy material (AlGaAs) to increase the energy difference between the (111)A sidewall facet quantum well and the (001) flat facet quantum well or the V-groove bottom quantum wire.

Figure 8:
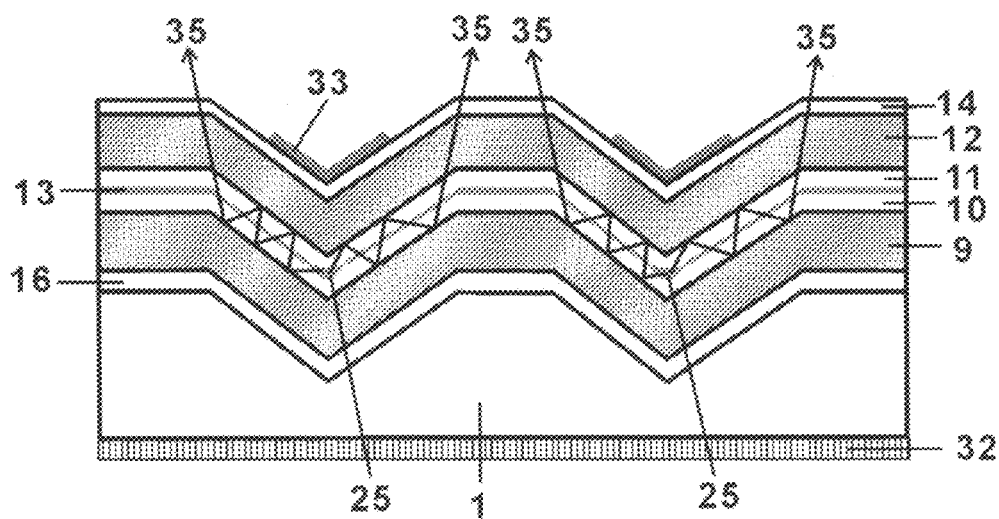
FIG. 8 is a schematic sectional view for explaining lateral waveguide effect in extraction of quantum wire (QWR) luminescence.

Also, as is understood from the device structure of FIG. 6 and the electroluminescence spectra of FIG. 7, the very strong emission is observed from the crescent-shaped quantum wire 25 even if the crescent-shaped quantum wire lies just under the metal electrode 33. This is considered to be due to a light waveguiding effect in the lateral direction, as shown in FIG. 8. Specifically, in this device, the barrier layers 10 and 11 (percentage composition of Al: about 30%) low in the Al composition are considered to serve as a lateral waveguide sandwiched between the barrier layers 9 and 12 (percentage composition of Al: about 65%) high in the Al composition. Then, it is considered that a part of the emission 35 from the quantum wire 25 is guided by this waveguide in the lateral direction and allowed to be extracted to the outside space from the light-extraction area between the electrodes 33 through the (111)A sidewall facet.

FIG. 9 is a graph showing the dependency of light output power and external quantum efficiency on injected current.

As shown in the figure, an external quantum efficiency as high as about 7% is obtained under a current about 50 mA. Further, from the comparison between the integrated emission intensity at the room temperature and that at a low temperature (4.5 K), the internal quantum efficiency at the room temperature is calculated to be about 46%. By using these values, an efficiency in extraction of light to the outside space is obtained to be about 15.2%. This value is about one order of magnitude higher than the theoretical value of the light extraction efficiency obtained in the case of a flat substrate. Further, the emission pattern was observed by a CCD camera, and, as a result, it is found that the emission intensity from the region where the (001) flat facet and the (111)A sidewall facet intersect is stronger than the emission from the center part of the (001) flat facet. From these results, the effect of suppressing the total internal reflection at the interface due to the presence of the (111)A sidewall facet is apparently confirmed. It is expected that, by encapsulating the chip with an epoxy resin, the extraction efficiency could be further improved.

Next, another example of the present invention will be explained with reference to FIGS. 10a and 10b.

Figure 10A:
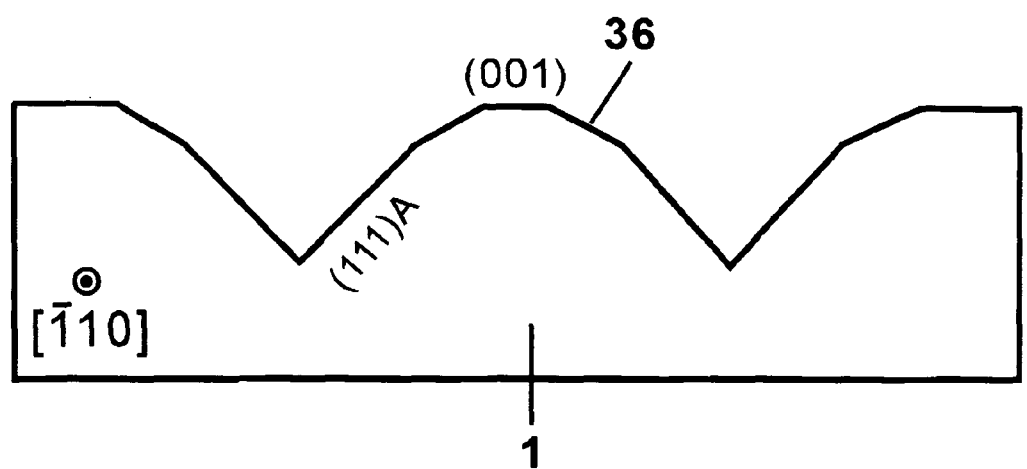
FIG. 10a is a schematic sectional view of a substrate used for growth of an epitaxial layer according to another example of the present invention.
Figure 10B:
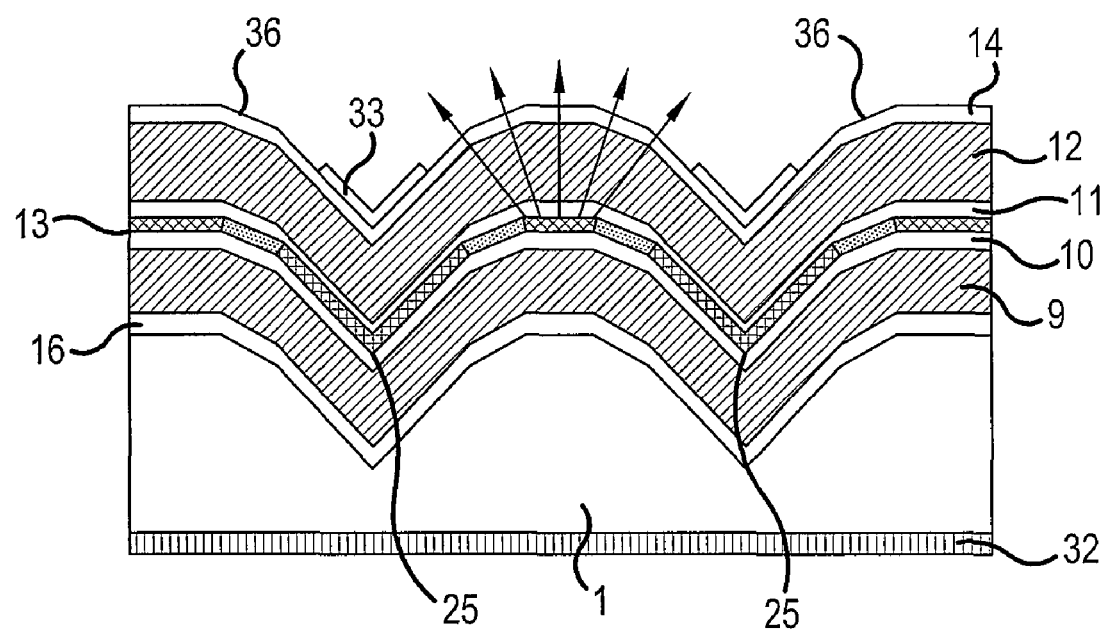
FIG. 10b is a schematic sectional view of the III-V group compound semiconductor light-emitting diode according to the above another example of the present invention.

FIG. 10a is a schematic sectional view of a substrate used for the growth of a sample in this example; and FIG. 10b is a schematic sectional view of a III-V group compound semiconductor light-emitting diode according to the invention of this example.

In these figures, reference numeral 36 represents a crystal plane having an index higher than that of the (111)A facet.

First, line-space patterns of photoresist were formed on the (001) flat GaAs substrate 1 in the [1-10] direction by using photolithography. Then, the above substrate was etched using a solution of $NH_4OH:H_2O_2:H_2O=1:3:50$, to form V-groove shape patterns constituted of two (111)A sidewall facets and one (001) top flat facet on the substrate. Thereafter, the etching solution was altered to, for example, a solution of $NH_4OH:H_2O_2:H_2O=4:0.5:40$, to carry out additional etching, under the condition that the photoresist remained on the (001) flat facet. This additional etching makes it possible to form the crystal plane 36, for example, a (113)A facet, having a higher index than the (111)A facet between the (111)A sidewall facet and the (001) flat facet (FIG. 10a). Here, by changing the amount of $H_2O_2$ in the $NH_4OH:H_2O_2:H_2O$ solution used for the additional etching, it is possible to control the facet direction of the higher-index facet 36 to be formed, i.e. the intersection angle between the higher-index facet 36 and the (001) flat facet. For example, besides the (113)A facet, other higher-index facet 36, such as a (112)A facet or a (114)A facet, can be formed. FIG. 10a shows the case where one higher-index facet 36 is formed between the (111)A sidewall facet and the (001) flat facet. However, for example, by changing the etching solutions stepwise, two or more facets each having a different facet direction, that is, two or more higher-index facets between the (111)A sidewall facet and the (001) flat facet may be formed as the higher-index facet 36.

Next, after the photoresist was removed, a light-emitting diode structure having the same structure as in Example 1 was grown on the above substrate by the metal-organic vapor phase epitaxy method. Here, the width and Al composition of the higher-index facet 36 can be controlled by the growth conditions, particularly the growth temperature and the flow rate of As. Thus, similar to the above, the anisotropy in crystal growth can make an active layer and a barrier layer to have bandgap energies that are different in the in-plane direction, i.e. it is possible to control the (111)A facet, the higher-index facet 36, and the (001) facet to have the bandgap energies different from each other. Specifically, the active layers can be grown to have bandgap energies such that the bandgap energy is higher on the (111)A facet, that the bandgap energy is lower on the (001) facet, and that the bandgap energy is a value between these higher and lower ones on the higher-index facet 36. Further, in this example, since AlGaAs was used in the barrier layer, due to the anisotropy in crystal growth, it is possible to grow the barrier layers to have bandgap energies such that the bandgap energy is higher on the (111)A facet, that the bandgap energy is lower on the (001) facet, and that the bandgap energy is a value between these higher and lower ones on the higher-index facet 36.

Then, after the completion of crystal growth, by using the similar process as in the above Example 1, the p-type electrode 33 and the n-type electrode 32 were formed on a part of the (111)A facet (in the V-groove) and on the entire back surface, respectively, to obtain a light-emitting diode, as shown in FIG. 10b. This electrode (33) may cover the (111)A facet and a part thereof may cover a part of the higher-index facet 36.

In this structure, carriers injected from electrodes are transferred to the (001) flat facet quantum well and the V-groove bottom crescent-shaped quantum wire each having a lower energy level, through the (Al)GaAs active layer or the (Al)GaAs active layer and the AlGaAs barrier layer, thereby to allow emitting light there.

In this device, due to the presence of the higher-index facet 36, the sectional shape of the light extraction area between the V-shaped electrodes can be made closer to a semicircle shape in the lateral direction, which is most effective to suppress the total internal reflection. Therefore, the effect of suppressing the total internal reflection can be expected to be further improved to the case where no higher-index facet (36) is provided.

According to the III-V group compound semiconductor light-emitting diode of the present invention, an epitaxially-grown layer that is to become an active layer is at least constituted of plural crystal planes each having a different bandgap energy, and a metal electrode for injecting current is formed on the crystal plane having a higher bandgap energy in such a manner to sweep away from the radiation path of light emitted from the crystal plane having a lower bandgap energy, to spatially separate the current-injection area from the light-emitting area, to thereby give a light-emitting diode almost free from the conventional problem of the blocking of light by the opaque metal electrode.

Further, because a substrate having a convex sectional shape is used, the ratio of light incident to the surface at an angle smaller than the critical angle of the total internal reflection increases, and it is therefore possible to effectively suppress total internal reflection occurring at the semiconductor-air interface.

Furthermore, the output light power of the III-V group compound semiconductor light-emitting diode of the present invention can be made to increase in proportion to the area of a sample, and the III-V group compound semiconductor light-emitting diode of the present invention is particularly preferable to applications requiring high light-output power.

Having described my invention as related to the present embodiments, it is my intention that the invention not be limited by any of the details of the description, unless other-

What I claim is:

1. A III-V group compound semiconductor light-emitting diode, comprising a substrate having plural crystal planes, and a grown layer positioned on the substrate and formed by epitaxial growth, the grown layer at least including a barrier layer and an active layer,
wherein at least said active layer of said grown layer has plural crystal planes, each having a different bandgap energy in the in-plane direction, and
wherein an Ohmic electrode for current injection is provided only on a crystal plane of an uppermost surface layer which corresponds to a crystal plane of said active layer having a higher bandgap energy among the plural crystal planes in said active layer.

2. The III-V group compound semiconductor light-emitting diode according to claim 1, wherein said plural crystal planes each having a different bandgap energy comprise a first crystal plane having a higher bandgap energy among the plural crystal planes, a second crystal plane having a lower bandgap energy, and at least one crystal plane positioned between the first and second crystal planes, and wherein the at least one crystal plane positioned between the first and second crystal planes has a bandgap energy between the bandgap energy of said first crystal plane and the bandgap energy of said second crystal plane.

3. The III-V group compound semiconductor light-emitting diode according to claim 2, wherein said active layer is to be a quantum well structure in the case where the active layer is formed of a binary compound, or to be a quantum well structure or a bulk structure in the case where the active layer is formed of a ternary or quaternary alloy.

4. The III-V group compound semiconductor light-emitting diode according to claim 1, wherein a large number of said plural crystal planes each having a different bandgap energy are provided in array in the in-plane direction.

5. The III-V group compound semiconductor light-emitting diode according to claim 4, wherein said active layer is to be a quantum well structure in the case where the active layer is formed of a binary compound, or to be a quantum well structure or a bulk structure in the case where the active layer is formed of a ternary or quaternary alloy.

6. The III-V group compound semiconductor light-emitting diode according to claim 1, wherein said substrate has a groove shape which extends along the [1-10] direction and is constituted of two (111)A facets, a top (001) facet, and a bottom (001) facet, and
wherein, among the plural crystal planes each having a different bandgap energy, the crystal plane having a lower bandgap energy and the crystal plane having a higher bandgap energy are grown on the (001) facet and the (111)A facet of said substrate, respectively, and said Ohmic electrode is provided on the (111)A facet.

7. The III-V group compound semiconductor light-emitting diode according to claim 1, wherein said substrate has a V-groove shape which extends along the [1-10] direction and is constituted of two (111)A facets and a top (001) facet, and
wherein, among the plural crystal planes each having a different bandgap energy, the crystal plane having a lower bandgap energy and the crystal plane having a higher bandgap energy are grown on the (001) facet and the (111)A facet of said substrate, respectively, and said Ohmic electrode is provided on the (111)A facet.

8. The III-V group compound semiconductor light-emitting diode according to claim 1, wherein said substrate has a (111)A facet, a top (001) facet, and at least one higher-index facet formed between the (111)A facet and the top (001) facet, and
wherein, among the plural crystal planes each having a different bandgap energy, the crystal plane having a lower bandgap energy and the crystal plane having a higher bandgap energy are grown on the top (001) facet and the (111)A facet of said substrate, respectively, and said Ohmic electrode is provided on the (111)A facet.

9. The III-V group compound semiconductor light-emitting diode according to claim 1, wherein said active layer is to be a quantum well structure in the case where the active layer is formed of a binary compound, or to be a quantum well structure or a bulk structure in the case where the active layer is formed of a ternary or quaternary alloy.

10. The III-V group compound semiconductor light-emitting diode according to claim 1, wherein said uppermost surface layer is said barrier layer or a cap layer.

11. A III-V group compound semiconductor light-emitting diode, comprising a substrate having plural crystal planes, and a grown layer positioned on the substrate and formed by epitaxial growth, the grown layer at least including a barrier layer and an active layer,
wherein at least said active layer of said grown layer has plural crystal planes, each having a different bandgap energy in the in-plane direction, a first Ohmic electrode for current injection is provided only on one surface of a crystal plane of an uppermost surface layer which corresponds to a crystal plane of said active layer having a higher bandgap energy among the plural crystal planes in said active layer, and a second Ohmic electrode for current injection is provided only on the other surface of said crystal plane of the uppermost surface layer which corresponds to said crystal plane of said active layer having a higher bandgap energy among the plural crystal planes in said active layer, after removing the substrate from the grown layer.

12. The III-V group compound semiconductor light-emitting diode according to claim 11, wherein said plural crystal planes each having a different bandgap energy comprise a first crystal plane having a higher bandgap energy among the plural crystal planes, a second crystal plane having a lower bandgap energy, and at least one crystal plane positioned between the first and second crystal planes, and wherein the at least one crystal plane positioned between the first and second crystal planes has a bandgap energy between the bandgap energy of said first crystal plane and the bandgap energy of said second crystal plane.

13. The III-V group compound semiconductor light-emitting diode according to claim 12, wherein said active layer is to be a quantum well structure in the case where the active layer is formed of a binary compound, or to be a quantum well structure or a bulk structure in the case where the active layer is formed of a ternary or quaternary alloy.

14. The III-V group compound semiconductor light-emitting diode according to claim 11, wherein a large number of said plural crystal planes each having a different bandgap energy are provided in array in the in-plane direction.

15. The III-V group compound semiconductor light-emitting diode according to claim 14, wherein said active layer is to be a quantum well structure in the case where the active layer is formed of a binary compound, or to be a quantum well structure or a bulk structure in the case where the active layer is formed of a ternary or quaternary alloy.

16. The III-V group compound semiconductor light-emitting diode according to claim 11, wherein said substrate has a groove shape which extends along the [1-10] direction and is constituted of two (111)A facets, a top (001) facet, and a bottom (001) facet, and wherein, among the plural crystal planes each having a different bandgap energy, the crystal plane having a lower bandgap energy and the crystal plane having a higher bandgap energy are grown on the (001) facet and the (111)A facet of said substrate, respectively, and said Ohmic electrode is provided on the (111)A facet.

17. The III-V group compound semiconductor light-emitting diode according to claim 11, wherein said substrate has a V-groove shape which extends along the [1-10] direction and is constituted of two (111)A facets and a top (001) facet, and wherein, among the plural crystal planes each having a different bandgap energy, the crystal plane having a lower bandgap energy and the crystal plane having a higher bandgap energy are grown on the (001) facet and the (111)A facet of said substrate, respectively, and said Ohmic electrode is provided on the (111)A facet.

18. The III-V group compound semiconductor light-emitting diode according to claim 11, wherein said substrate has a (111)A facet, a top (001) facet, and at least one higher-index facet formed between the (111)A facet and the top (001) facet, and wherein, among the plural crystal planes each having a different bandgap energy, the crystal plane having a lower bandgap energy and the crystal plane having a higher bandgap energy are grown on the top (001) facet and the (111)A facet of said substrate, respectively, and said Ohmic electrode is provided on the (111)A facet.

19. The III-V group compound semiconductor light-emitting diode according to claim 11, wherein said active layer is to be a quantum well structure in the case where the active layer is formed of a binary compound, or to be a quantum well structure or a bulk structure in the case where the active layer is formed of a ternary or quaternary alloy.

20. The III-V group compound semiconductor light-emitting diode according to claim 11, wherein said uppermost surface layer is said barrier layer or a cap layer.

* * * * *